United States Patent
Choo et al.

(10) Patent No.: US 9,982,165 B2
(45) Date of Patent: May 29, 2018

(54) POLISHING SLURRY FOR SILICON, METHOD OF POLISHING POLYSILICON AND METHOD OF MANUFACTURING A THIN FILM TRANSISTOR SUBSTRATE

(71) Applicants: SAMSUNG DISPLAY CO., LTD., Yongin-si, Gyeonggi-do (KR); UBmaterials Inc., Yongin-si, Gyeonggi-do (KR)

(72) Inventors: Byoung-Kwon Choo, Hwaseong-si (KR); Jin-Hyung Park, Seongnam-si (KR); Jeong-Kyun Na, Suwon-si (KR); Joon-Hwa Bae, Suwon-si (KR); Byoung-Ho Cheong, Yongin-si (KR); Joo-Woan Cho, Seongnam-si (KR); In-Sun Hwang, Suwon-si (KR)

(73) Assignees: SAMSUNG DISPLAY CO., LTD., Yongin-si, Gyeonggi-do (KR); UBmaterials Inc., Yongin-si, Gyeonggi-do (KR)

( * ) Notice: Subject to any disclaimer, the term of this patent is extended or adjusted under 35 U.S.C. 154(b) by 0 days. days.

(21) Appl. No.: 15/355,917

(22) Filed: Nov. 18, 2016

(65) Prior Publication Data
US 2017/0145259 A1    May 25, 2017

(30) Foreign Application Priority Data

Nov. 20, 2015    (KR) .................. 10-2015-0163383

(51) Int. Cl.
*C09K 13/04* (2006.01)
*C09G 1/02* (2006.01)
(Continued)

(52) U.S. Cl.
CPC .............. *C09G 1/02* (2013.01); *C09K 3/1409* (2013.01); *H01L 21/3212* (2013.01);
(Continued)

(58) Field of Classification Search
CPC ... C09G 1/02; C09K 3/1409; G02F 2202/104; H01L 21/30625; H01L 27/1222;
(Continued)

(56) References Cited

U.S. PATENT DOCUMENTS 9,163,162 B2 * 10/2015 Akutsu ................. C09K 3/1409
2005/0090109 A1 * 4/2005 Carter ...................... C09G 1/02
438/692

(Continued)

FOREIGN PATENT DOCUMENTS

KR    10-2001-0041017 A    5/2001
KR    10-2005-0060213 A    6/2005
(Continued)

OTHER PUBLICATIONS

Peng, et al. "Treatments in ELA Process to Improve the Image Quality in AMOLED Displays" SID 06 Digest (2006) pp. 1696-1699.

*Primary Examiner* — Lan Vinh
(74) *Attorney, Agent, or Firm* — Lee & Morse, P.C.

(57) ABSTRACT

A polishing slurry for silicon, a method of polishing polysilicon, and a method of manufacturing a thin film transistor substrate, the slurry including a polishing particle; a dispersing agent including an anionic polymer, a hydroxyl acid, or an amino acid; a stabilizing agent including an organic acid, the organic acid including a carboxyl group; a hydrophilic agent including a hydrophilic group and a hydrophobic group, and water, wherein the polishing particle is included in the polishing slurry in an amount of about 0.1% by weight to about 10% by weight, based on a total weight of the slurry, a weight ratio of the polishing particle and the dispersing agent is about 1:0.01 to about 1:0.2, a weight ratio of the polishing particle and the stabilizing agent is about 1:0.001 to about 1:0.1, and a weight ratio of the polishing (Continued)

particle and the hydrophilic agent is about 1:0.01 to about 1:3.

20 Claims, 9 Drawing Sheets

(51) Int. Cl.
| | |
|---|---|
| C09K 3/14 | (2006.01) |
| H01L 27/12 | (2006.01) |
| H01L 29/786 | (2006.01) |
| H01L 21/321 | (2006.01) |
| H01L 27/32 | (2006.01) |
| G02F 1/1368 | (2006.01) |

(52) U.S. Cl.
CPC ...... H01L 27/1222 (2013.01); H01L 27/1274 (2013.01); H01L 29/78675 (2013.01); *B81C 2201/0104* (2013.01); *G02F 1/1368* (2013.01); *G02F 2202/104* (2013.01); *H01L 27/3262* (2013.01)

(58) Field of Classification Search
CPC ............... H01L 27/1274; H01L 27/326; H01L 21/3212; B81C 2201/0104; B24C 1/08
USPC ...... 252/79.1, 79.2, 79.3; 438/691, 692, 693; 216/88
See application file for complete search history.

(56) References Cited

U.S. PATENT DOCUMENTS

| | | | | |
|---|---|---|---|---|
| 2006/0216936 | A1* | 9/2006 | Akatsuka | C09G 1/02 438/691 |
| 2009/0072294 | A1* | 3/2009 | Yang | H01L 27/11521 257/321 |
| 2010/0003897 | A1* | 1/2010 | Kim | C09G 1/02 451/41 |
| 2011/0059680 | A1* | 3/2011 | Motonari | C09G 1/02 451/36 |
| 2011/0293216 | A1* | 12/2011 | Lipson | G02B 6/12007 385/14 |
| 2013/0109194 | A1* | 5/2013 | Shirota | C09G 1/02 438/759 |

FOREIGN PATENT DOCUMENTS

| | | | |
|---|---|---|---|
| KR | 10-2005-0122895 | A | 12/2005 |
| KR | 10-2006-0006194 | A | 1/2006 |
| KR | 10-2006-0015850 | A | 2/2006 |
| KR | 10-2006-0015851 | A | 2/2006 |
| KR | 10-0641348 | B1 | 11/2006 |
| KR | 10-2006-0123878 | A | 12/2006 |
| KR | 10-2007-0023163 | A | 2/2007 |
| KR | 10-2007-0031666 | A | 3/2007 |
| KR | 10-2007-0051680 | A | 5/2007 |
| KR | 10-2007-0067262 | A | 6/2007 |
| KR | 10-0725803 | B1 | 6/2007 |
| KR | 10-0873235 | B1 | 12/2008 |
| KR | 10-2010-0033437 | A | 3/2010 |
| KR | 10-2010-0067489 | A | 6/2010 |
| KR | 10-2010-0067724 | A | 6/2010 |
| KR | 10-2010-0124988 | A | 11/2010 |
| KR | 10-2012-0096948 | A | 8/2012 |
| KR | 10-2013-0078605 | A | 7/2013 |
| KR | 10-1388106 | B1 | 4/2014 |
| KR | 10-1396250 | B1 | 5/2014 |
| KR | 10-2014-0072410 | A | 6/2014 |
| KR | 10-2014-0087666 | A | 7/2014 |
| KR | 10-2014-0087667 | A | 7/2014 |
| KR | 10-2014-0087668 | A | 7/2014 |
| KR | 10-2014-0102057 | A | 8/2014 |
| KR | 10-2015-0017909 | A | 2/2015 |
| KR | 10-2015-0024876 | A | 3/2015 |
| KR | 10-2015-0042321 | A | 4/2015 |
| KR | 10-1513606 | B1 | 4/2015 |
| KR | 10-2015-0053048 | A | 5/2015 |

* cited by examiner

LASER

POLISHING SLURRY FOR SILICON, METHOD OF POLISHING POLYSILICON AND METHOD OF MANUFACTURING A THIN FILM TRANSISTOR SUBSTRATE

CROSS-REFERENCE TO RELATED APPLICATION

Korean Patent Application No. 10-2015-0163383, filed on Nov. 20, 2015, in the Korean Intellectual Property Office, and entitled: "Polishing Slurry for Silicon, Method of Polishing Polysilicon and Method of Manufacturing A Thin Film Transistor Substrate," is incorporated by reference herein in its entirety.

BACKGROUND

1. Field

Embodiments relate to a polishing slurry for silicon, a method of polishing polysilicon, and a method of manufacturing a thin film transistor substrate.

2. Description of the Related Art

A substrate including a thin film transistor may be used as a device driving each pixel of a display device such as a plasma display, a liquid crystal display, an organic light-emitting display, or the like.

A channel of the thin film transistor may include amorphous silicon, polysilicon (polycrystalline silicon), a semiconductor oxide, or the like.

SUMMARY

Embodiments are directed to a polishing slurry for silicon, a method of polishing polysilicon, and a method of manufacturing a thin film transistor substrate.

The embodiments may be realized by providing a polishing slurry for silicon, the polishing slurry including a polishing particle; a dispersing agent including an anionic polymer, a hydroxyl acid, or an amino acid; a stabilizing agent including an organic acid, the organic acid including a carboxyl group; a hydrophilic agent including a hydrophilic group and a hydrophobic group, and water, wherein the polishing particle is included in the polishing slurry in an amount of about 0.1% by weight to about 10% by weight, based on a total weight of the polishing slurry, a weight ratio of the polishing particle and the dispersing agent is about 1:0.01 to about 1:0.2, a weight ratio of the polishing particle and the stabilizing agent is about 1:0.001 to about 1:0.1, and a weight ratio of the polishing particle and the hydrophilic agent is about 1:0.01 to about 1:3.

The polishing particle may include silica, alumina, ceria, zirconia, or titania.

An average particle size of the polishing particle may be about 6 nm to about 350 nm.

The anionic polymer may include polysulfonic acid, polyacrylic acid, polymethacrylic acid, a copolymer thereof, or a salt thereof.

The hydrophilic agent may include an anionic hydrophilic agent or a non-ionic hydrophilic agent, the anionic hydrophilic agent may include a stearate, a sulfonate, a sulfate, or a phosphate, and the non-ionic hydrophilic agent may include polyethylene glycol, hydroxyethyl cellulose, polyvinylpyrrolidone, polyethylene amine, or a salt thereof.

The hydrophilic agent may include an alkylbenzene sulfonate, an alkylsulfate, or an alkylether sulfate, and a weight ratio of the polishing particle and the hydrophilic agent may be about 1:0.01 to about 1:1.

The stabilizing agent may include formic acid, acetic acid, butyric acid, oxalic acid, lactic acid, or citric acid.

A pH of the polishing slurry may be about 9 to about 11.

The embodiments may be realized by providing a method of polishing polysilicon, the method including forming an amorphous silicon film; irradiating a laser to the amorphous silicon film to form a polysilicon film; and polishing the polysilicon film with a polishing slurry, wherein the polishing slurry includes a polishing particle, a dispersing agent including an anionic polymer, a hydroxyl acid, or an amino acid, a stabilizing agent including an organic acid, the organic acid including a carboxyl group, a hydrophilic agent including a hydrophilic group and a hydrophobic group, and water, wherein the polishing particle is included in the polishing slurry in an amount of about 0.1% by weight to about 10% by weight, based on a total weight of the polishing slurry, a weight ratio of the polishing particle and the dispersing agent is about 1:0.01 to about 1:0.2, a weight ratio of the polishing particle and the stabilizing agent is about 1:0.001 to about 1:0.1, and a weight ratio of the polishing particle and the hydrophilic agent is about 1:0.01 to about 1:3.

A grain size of the polysilicon film may be about 300 nm to about 320 nm.

The method may further include polishing the polysilicon film with deionized water after polishing the polysilicon film with the polishing slurry.

The method may further include polishing the polysilicon film with a same material as the hydrophilic agent of the polishing slurry after polishing the polysilicon film with the polishing slurry.

The anionic polymer may include polysulfonic acid, polyacrylic acid, polymethacrylic acid, a copolymer thereof, or a salt thereof, the hydrophilic agent may include an alkylbenzene sulfonate, an alkylsulfate, or an alkylether sulfate, and the stabilizing agent may include formic acid, acetic acid, butyric acid, oxalic acid, lactic acid, or citric acid.

The embodiments may be realized by providing a method of manufacturing a thin film transistor substrate, the method including forming an amorphous silicon film on a base substrate; irradiating a laser to the amorphous silicon film to form a polysilicon film; polishing the polysilicon film with a polishing slurry, the polishing slurry including a polishing particle, a dispersing agent including an anionic polymer, a hydroxyl acid, or an amino acid, a stabilizing agent including an organic acid, the organic acid including a carboxyl group, a hydrophilic agent including a hydrophilic group and a hydrophobic group, and water, wherein the polishing particle is included in the polishing slurry in an amount of about 0.1% by weight to about 10% by weight, based on a total weight of the polishing slurry, a weight ratio of the polishing particle and the dispersing agent is about 1:0.01 to about 1:0.2, a weight ratio of the polishing particle and the stabilizing agent is about 1:0.001 to about 1:0.1, and a weight ratio of the polishing particle and the hydrophilic agent is about 1:0.01 to about 1:3; patterning the polysilicon film to form a polysilicon pattern; forming a first insulation layer that covers the polysilicon pattern; forming a gate metal layer on the first insulation layer; patterning the gate metal layer to form a gate electrode; and implanting an ion into a portion of the polysilicon pattern to form an active pattern including a source region, a channel region and a drain region.

A thickness of the polysilicon film after polished may be about 30 nm to about 50 nm.

A root-mean-square roughness of the polysilicon film after polishing may be less than about 1 nm.

A grain size of the polysilicon film may be about 300 nm to about 320 nm.

A thickness of the first insulation layer may be about 30 nm to about 80 nm.

The method may further include polishing the polysilicon film with deionized water after polishing the polysilicon film with the polishing slurry.

The method may further include polishing the polysilicon film with a same material as the hydrophilic agent of the polishing slurry after polishing the polysilicon film with the polishing slurry.

The anionic polymer may include polysulfonic acid, polyacrylic acid, polymethacrylic acid, a copolymer thereof, or a salt thereof, the hydrophilic agent may include an alkylbenzene sulfonate, an alkylsulfate, or an alkylether sulfate, and the stabilizing agent may include formic acid, acetic acid, butyric acid, oxalic acid, lactic acid, or citric acid.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
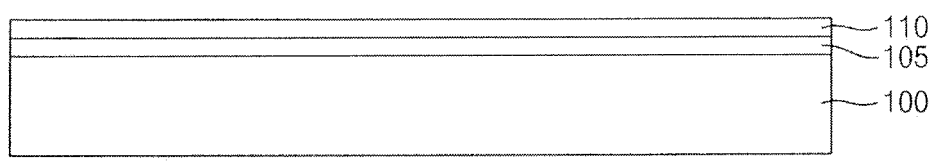
FIGS. 1 to 14 illustrate cross-sectional view of stages in a method of manufacturing a thin film transistor substrate according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening elements may also be present. Further, it will be understood that when an element is referred to as being "under" another element, it can be directly under, and one or more intervening elements may also be present. In addition, it will also be understood that when an element is referred to as being "between" two element, it can be the only element between the two elements, or one or more intervening elements may also be present. Like reference numerals refer to like elements throughout. In the specification, the term "or" is not an exclusive term, e.g., A or B would also include A and B.

Hereinafter, a polishing slurry for polishing a silicon film, a method of polishing silicon film, and a method of manufacturing a thin film transistor substrate according to exemplary embodiments will be described more fully hereinafter with reference to the accompanying drawings, in which various embodiments are shown.

Polishing Slurry for Silicon

A polishing slurry for silicon according to an exemplary embodiment includes a polishing particle, a dispersing agent, a stabilizing agent, a hydrophilic agent and water. The polishing slurry may be used for polishing a silicon film such as a polysilicon film. For example, the polysilicon film may be formed by irradiating a laser to an amorphous silicon film.

The polishing slurry may have an appropriate pH depending on a polishing object. For example, when the polishing slurry is used for polishing a polysilicon film, pH of the polishing slurry may be about 6 to about 14. Maintaining a sufficiently high pH of the polishing slurry may help ensure that a polishing rate is not too small to polish a silicon film. Maintaining a sufficiently low pH of the polishing slurry helps ensure that a silicon film may not be damaged, or may be uniformly polished. In an implementation, the pH of the polishing slurry may be about 9 to about 11.

In an implementation, the polishing slurry may further include a sodium hydroxide, potassium hydroxide, ammonium hydroxide, or the like to have a desired pH.

Examples of the polishing particle may include a metal oxide such as silica, alumina, ceria, zirconia, titania, or the like. These may be used each alone or in a combination thereof. The term "polishing particle" may refer to a plurality of polishing particles.

In an implementation, the polishing particle may include a ceria particle. In an implementation, the ceria particle may have a crystal structure of precipitated ceria, and may have a polygonal crystal face.

In an implementation, an average particle size of the polishing particle may be about 6 nm to about 350 nm, e.g., about 20 nm to about 100 nm or about 20 nm to about 50 nm. Maintaining a sufficiently high average particle size of the polishing particle may help ensure that a polishing rate to a silicon film is not reduced. Maintaining a suitably low average particle size of the polishing particle may help ensure that a scratch may not be formed at a silicon film polished by the polishing slurry.

The polishing particle may be included in the slurry in an amount of, e.g., about 0.1% by weight to about 10% by weight, based on a total weight of the polishing slurry. In an implementation, the polishing particle may be included in an amount of about 0.3% by weight to about 3% by weight. Maintaining the amount of the polishing particle at about 0.1% by weight or greater may help ensure that a polishing rate to a silicon film is not reduced. Maintaining the amount of the polishing particle at about 10% by weight or less may help ensure that a dispersing ability of the polishing slurry is not reduced and may help ensure that a scratch is not formed at a silicon film polished by the polishing slurry.

The dispersing agent may help prevent cohesion of the polishing particle and may help increase dispersing ability of the polishing slurry. The dispersing agent may include a material capable of turning a surface potential of the polishing particle into minus. In an implementation, the dispersing agent may include, e.g., an anionic polymer, a hydroxyl acid, an amino acid, or the like.

In an implementation, the anionic polymer may include polysulfonic acid, polyacrylic acid, polymethacrylic acid, a copolymer thereof, or a salt thereof. In an implementation, the hydroxyl acid may include hydroxylbenzoic acid, ascorbic acid, or a salt thereof. In an implementation, the amino acid may include picolinic acid, glutamic acid, tryptophan, aminobutylic acid, or a salt thereof. These may be used each alone or in a combination thereof.

In an implementation, the dispersing agent may include the anionic polymer. The anionic polymer may have a relatively high zeta potential, and the anionic polymer may help effectively disperse the polishing particle even with a small content. Maintaining a sufficiently small amount of the dispersing agent may help ensure that an ionized concentration in the polishing slurry is not increased thereby helping to ensure that a dispersing stability of the polishing slurry is not deteriorated. In an implementation, the dispersing agent may include polyacrylic acid or polymethacrylaic acid, which has a weight average molecular weight of about 5,000 to about 20,000. These may be used each alone or in a combination thereof.

A content of the dispersing agent may be determined based on a weight of the polishing particle. For example, a weight ratio of the polishing particle and the dispersing agent may be about 1:0.01 to about 1:0.2. Thus, when the polishing slurry includes about 1% by weight of the polishing particle, a content of the dispersing agent may be about 0.01% by weight to about 0.2% by weight based on a total weight of the polishing slurry. Maintaining the weight ratio of the dispersing agent to the polishing particle at about 0.01 or greater may help ensure that a dispersing ability of the polishing particle is not reduced, thereby reducing and/or preventing precipitation. Maintaining the weight ratio of the dispersing agent to the polishing particle at about 0.2 or less may help prevent cohesion of the polymer dispersing agent and/or may help prevent a reduction in dispersing stability (which may otherwise occur due to an increased ionized concentration). In an implementation, the weight ratio of the polishing particle and the dispersing agent may be about 1:0.02 to about 1:0.06.

The stabilizing agent may include an organic acid. The organic acid may have a negative charge by or due to the presence of a carboxyl group. The stabilizing agent may adhere to the polishing particle to increase an absolute value of a zeta potential. Thus, a dispersing ability of the polishing slurry may be improved. Furthermore, the stabilizing agent may function as a pH buffer to inhibit chemical change of the polishing slurry. Thus, undesirable cohesion of the polishing particle may be prevented. The stabilizing agent may have pKa equal to or less than 6. pKa is a dissociation constant absolute value of acid dissociation constant (Ka), which is converted by log, and may be calculated by the following equation.

$$K_a = \frac{[H_3O^+][A^-]}{[AH]}, pK_a = -\log K_a$$

In an implementation, the stabilizing agent may include an amino acid, a carboxyl acid, or the like. Examples of the amino acid may include a neutral amino acid, which has a same number of —COOH and —NH$_2$, such as alanine, glycine, tyrosine, valine or the like, an acidic amino acid, which has more —COOH than —NH$_2$, such as aspartic acid, glutamine acid or the like, or a basic amino acid, which has more —NH$_2$ than —COOH, such as lysine or the like. Examples of the carboxyl acid may include formic acid, acetic acid, butyric acid, oxalic acid, lactic acid, citric acid, or the like. These may be used each alone or in a combination thereof.

A content of the stabilizing agent may be determined based on a weight of the polishing particle. In an implementation, a weight ratio of the polishing particle and the stabilizing agent may be about 1:0.001 to about 1:0.1. Thus, when the polishing slurry includes about 1% by weight of the polishing particle, a content of the stabilizing agent may be about 0.001% by weight to about 0.1% by weight based on a total weight of the polishing slurry. Maintaining the weight ratio of the stabilizing agent to the polishing particle at about 0.001 or greater may help ensure that a pH buffer capacity is not reduced. Maintaining the weight ratio of the stabilizing agent to the polishing particle at about 0.1 or less may help ensure that a dispersing stability is not reduced.

The hydrophilic agent may include a hydrophilic group and a hydrophobic group. For example, the hydrophilic agent may be an amphiphilic material that provides a hydrophilic surface or area on a film. The hydrophilic agent may adhere to the polishing particle and a polishing byproduct thereby increasing activity of particles and reducing surface tension of the particles. Furthermore, the hydrophobic group of the hydrophilic agent may be combined with a surface of a polished silicon film so that the hydrophilic group is exposed externally. Thus, a water film may be formed on the surface of the polished silicon film, and a polishing particle and a polishing byproduct, which remain on the surface of the polished silicon film after a polishing process, may be easily removed.

Examples of the hydrophilic agent may include an anionic hydrophilic agent and a non-ionic hydrophilic agent.

The anionic hydrophilic agent may include a material having pKa equal to or less than 6 so that the anionic hydrophilic agent may have an anion in a basic range that is a pH area of the polishing slurry.

For example, the anionic hydrophilic agent may include a stearate, a sulfonate, a sulfate, a phosphate, or the like. In an implementation, the anionic hydrophilic agent may include, e.g., sodium stearate, an alkylbenzene sulfonate, an alkylsulfate, cholic acid, dioxycholic acid, sodium dodecylsulfate, an alkylether sulfate, or the like. In an implementation, the anionic hydrophilic agent may include sulfonate or sulfate. These may be used each alone or in a combination thereof.

In an implementation, the non-ionic hydrophilic agent may include polyethylene glycol, hydroxylethyl cellulose, polyvinylpyrrolidone, polyethylene amine, or a salt thereof. These may be used each alone or in a combination thereof.

In an implementation, the polishing slurry may include the anionic hydrophilic agent. When the polishing slurry includes the anionic hydrophilic agent, the polishing particle may be removed in a following process due to an electrical repulsive force between the polishing particle and a polysilicon film. Furthermore, the anionic hydrophilic agent may help reduce a contact angle of a water drop on the polysilicon film more than non-ionic hydrophilic agent. Thus, the polysilicon film may be uniformly hydrophilic-treated. The contact angle may be defined as an angle between a side surface of the water drop and an upper surface of the polysilicon film in a cross-sectional view. When a pH range of the polishing slurry may be about 6 to about 14, a pKa value of the anionic hydrophilic agent may be, e.g., about 0 to about 6.

A content of the hydrophilic agent may be determined based on a weight of the polishing particle. For example, a weight ratio of the polishing particle and the hydrophilic agent may be about 1:0.01 to about 1:3. Thus, when the polishing slurry includes about 1% by weight of the polishing particle, a content of the hydrophilic agent may be about 0.01% by weight to about 3% by weight based on a total weight of the polishing slurry. Maintaining the weight ratio of the hydrophilic agent to the polishing particle at about 0.01 or greater may help ensure that adhesion of the polishing particle to a silicon film is suitably prevented. Maintaining the weight ratio of the hydrophilic agent to the polishing particle at about 3 or less may help ensure that a polishing rate is not too low to remove protrusions on a surface of the silicon film. In an implementation, the weight ratio of the polishing particle and the hydrophilic agent may be about 1:0.01 to about 1:1.

Water may be included in a remainder or balance amount of the polishing slurry. For example, the balance amount may be determined by subtracting amount of the polishing particle, the dispersing agent, the stabilizing agent, and the hydrophilic agent. In an implementation, deionized water may be used.

The polishing slurry according to an exemplary embodiment may polish a polysilicon film. Furthermore, the polishing slurry may provide hydrophilicity to the polysilicon film so that a polishing particle and a byproduct particle, which remain after a polishing process, may be easily removed through a rinsing process.

Method of Polishing a Polysilicon Film and Method of Manufacturing a Thin Film Transistor Substrate FIGS. 1 to 14 illustrate cross-sectional view of stages in a method of manufacturing a thin film transistor substrate according to an exemplary embodiment. A method of polishing a polysilicon film according to an exemplary embodiment may be included in the method of manufacturing a thin film transistor substrate, and may be explained with reference to FIGS. 1 to 5.

Referring to FIG. 1, a buffer layer 105 may be formed on a base substrate 100.

For example, the base substrate 100 may include an insulating material such as glass, quartz, plastic or the like. Examples of the plastic may include polyethylene terephthalate, polyethylene naphthalate, polyether ketone, polycarbonate, polyarylate, polyether sulfone, polyimide or the like.

The buffer layer 105 may help prevent humidity or impurities generated by the base substrate 100 from diffusing, and may flatten a surface of the base substrate 100. The buffer layer 105 may include an organic material, an inorganic material, or a combination thereof. For example, the buffer layer 105 may have a single-layered structure or a multiple-layered structure, which includes at least one of silicon oxide, silicon nitride and silicon oxynitride. In an implementation, the buffer layer 105 may be omitted.

An amorphous silicon film 110 may be formed on the buffer layer 105. For example, the amorphous silicon film 110 may be formed through sputtering, low-pressure chemical vapor deposition (LPCVD), plasma-enhanced chemical vapor deposition (PECVD) or the like. For example, a thickness of the amorphous silicon film 110 may be about 30 nm to about 100 nm.

Figure 2:
Figure 2:
Figure 2:
Figure 2:
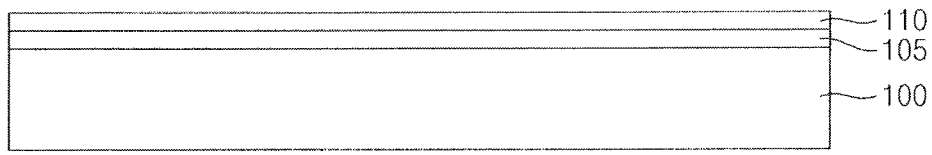
Figure 3:
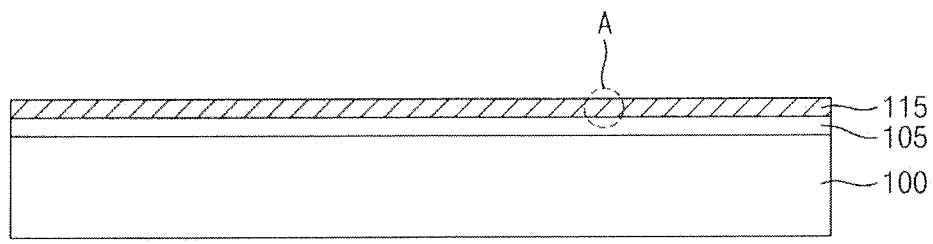

Referring to FIGS. 2 and 3, the amorphous silicon film 110 may be crystallized to form a polysilicon film 115. A laser may be irradiated onto the amorphous silicon film 110 to crystallize the amorphous silicon film 110. For example, the amorphous silicon film 110 may be crystallized through excimer laser annealing, sequential lateral solidification or the like. In an implementation, the amorphous silicon film 110 is crystallized through excimer laser annealing. A grain size of the polysilicon film 115 crystallized through the excimer laser annealing may be, e.g., about 300 nm to about 320 nm.

Figure 4:
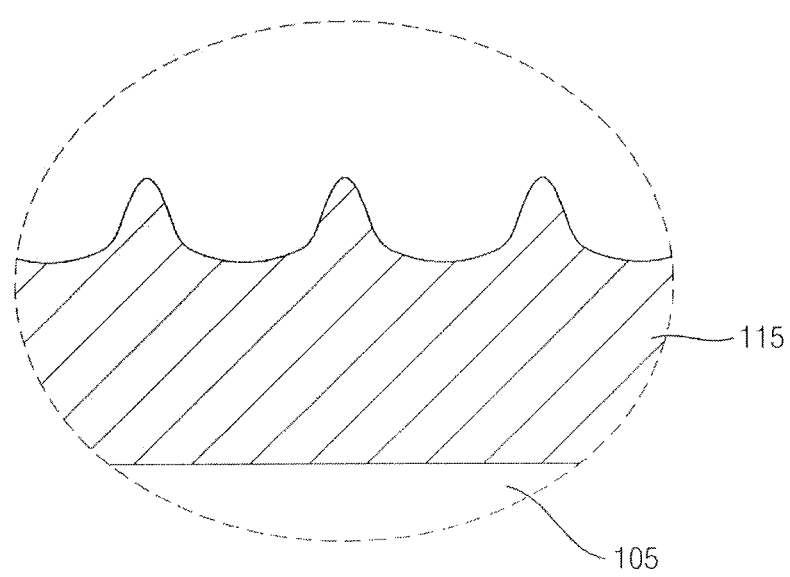

FIG. 4 illustrates an enlarged cross-sectional view of the polysilicon film 115 illustrated in FIG. 3.

Referring to FIG. 4, a protrusion having a fine size may be formed on an upper surface of the polysilicon film 115. When the amorphous silicon film 110 is crystallized through laser annealing, the protrusion may be formed on a grain boundary.

If the protrusion is not removed, a necessary thickness of a gate insulation layer may increase to compensate for height difference due to the protrusion. It may be difficult to manufacture a high-performance thin film transistor with a thick gate insulation layer.

Figure 5:
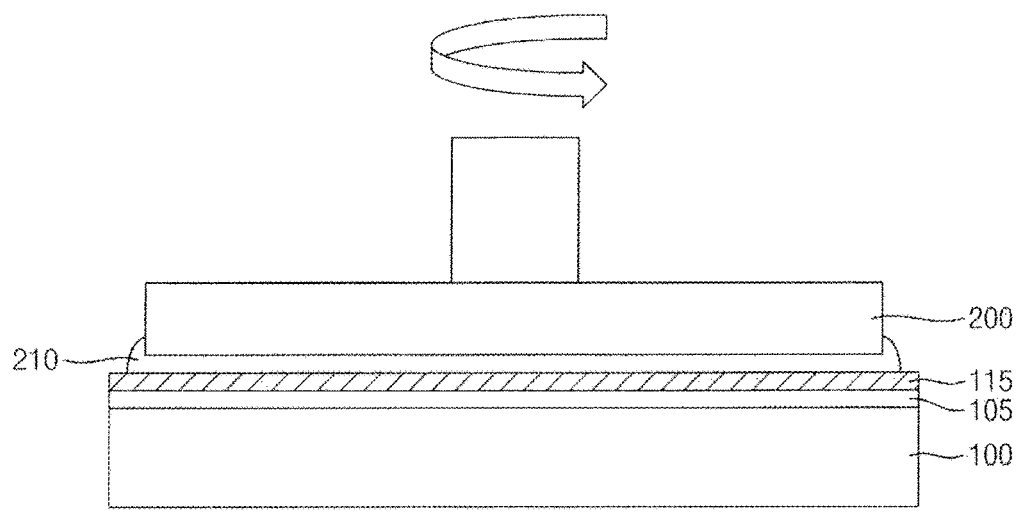

Referring to FIG. 5, the polysilicon film 115 may be mechanically and chemically polished by using a polishing apparatus 200 and a polishing slurry 210. The polishing apparatus 200 may include a head capable of rotating. The polishing slurry 210 may be provided between the head of the polishing apparatus 200 and the polysilicon film 115.

The polishing slurry 210 may include, e.g., the polishing particle, dispersing agent, stabilizing agent, hydrophilic agent, and water. The polishing particle may remove the protrusion with friction to flatten the polysilicon film 115. The polishing slurry may be the same as the polishing slurry previously explained above. Thus, a repeated explanation may be omitted.

After the polysilicon film 115 is polished by using the polishing slurry, a buffing process may be further performed. The buffing process may effectively remove polishing particles or defects, which may remain on a surface of the polysilicon film 115.

For example, the buffing process may be performed by using water (e.g., deionized water) and the polishing apparatus, or by using a hydrophilic agent and the polishing apparatus. The hydrophilic agent may be the same or substantially the same as that included in the polishing slurry, and may be provided with water. For example, the buffing process may include a first buffing process that polishes the polysilicon film 115 with providing water thereto, and a second buffing process that polishes the polysilicon film 115 with providing the hydrophilic agent thereto.

When the buffing process using the hydrophilic agent is performed, a hydrophilicity of the polysilicon film 115 may be increased.

Thereafter, deionized water or the like may be sprayed to clean or rinse the polysilicon film 115 so that a polishing particle and a byproduct particle on the surface of the polysilicon film 115 may be further removed.

If a surface of the polysilicon film 115 is hydrophobic, a polishing particle could easily adhere to the polysilicon film 115 after a polishing process. However, a method of polishing a polysilicon film according to an exemplary embodiment provides hydrophilicity to the surface of the polished polysilicon film 115 to form a water film thereon. Thus, contamination of the polysilicon film 115 due to adherence of impurities may be reduced and/or prevented. Thus, a quality and a reliability of an active pattern for a thin film transistor may be improved.

A thickness of the polished polysilicon film 115 may be less than a thickness of the amorphous silicon film 110. In order to achieve a high-performance thin film transistor, the polysilicon film 115 may have a small thickness, e.g., of about 30 nm to about 50 nm. In an implementation, a root-mean square (RMS) roughness of the polished polysilicon film 115 may be less than about 1 nm.

Figure 6:
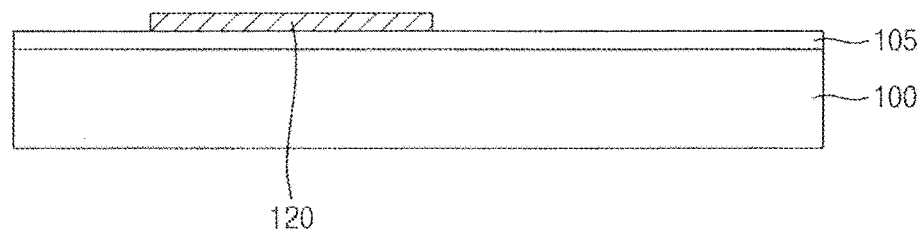

Referring to FIG. 6, the polysilicon film 115 may be patterned to form a polysilicon pattern 120.

Figure 7:
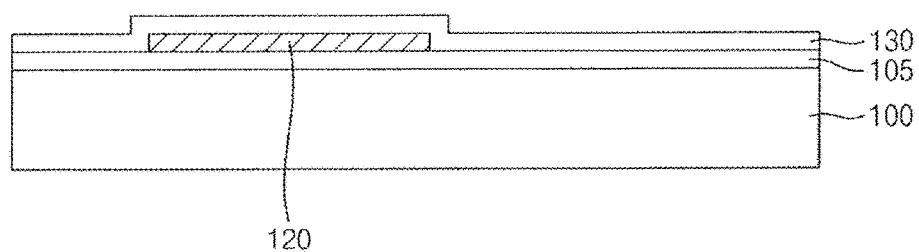

Referring to FIG. 7, a first insulation layer 130 may be formed to cover the polysilicon pattern 120. The first insulation layer 130 may be a gate insulation layer that insulates a channel layer, which is formed from the polysilicon pattern 120, from a gate electrode formed on the first insulation layer 130. For example, the first insulation layer 130 may have a single-layered structure or a multiple-layered structure, which includes at least one of silicon oxide and silicon nitride.

A thickness of the first insulation layer 130 may be about 30 nm to about 200 nm, e.g., about 30 nm to about 80 nm. If the protrusion of the polysilicon film 115 were not removed, it could be difficult to ensure that the first insulation layer 130 has a thickness equal to or less than 100 nm because the first insulation layer 130 may need to have a sufficient thickness to prevent a short. However, according to an exemplary embodiment, the polysilicon film 115 without the protrusion may be provided by a polishing process. Thus, a gate insulation layer having a thickness equal to or less than 80 nm may be formed. As a thickness of the gate insulation layer is reduced, distribution of a threshold voltage (Vth) may be reduced. As distribution of the threshold voltage (Vth) is reduced, a capacity of a threshold voltage compensation circuit included in a display device may be relatively increased. Thus, undesirable deterioration of display quality may be prevented.

Figure 8:
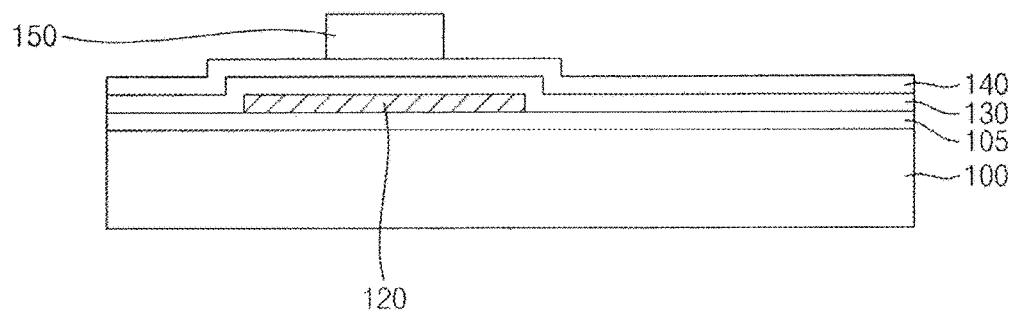

Referring to FIG. 8, a gate metal layer 140 may be formed on the first insulation layer 130, and a photoresist pattern 150 may be formed on the gate metal layer 140. The photoresist pattern 150 may overlap the polysilicon pattern 120.

The gate metal layer 140 may include gold, silver, aluminum, copper, nickel, platinum, magnesium, chrome, tungsten, molybdenum, titanium, or an alloy thereof. The gate metal layer 140 may have a single-layered structure or a multiple-layered structure including different metal layers. For example, the gate metal layer 140 may include a triple layer of molybdenum/aluminum/molybdenum, or a double layer of copper/titanium. Furthermore, the gate metal layer 140 may further include a metal oxide layer disposed on and/or under a metal layer. The metal oxide layer may include indium tin oxide, indium zinc oxide, gallium zinc oxide, or the like.

A photoresist composition may be provided on an upper surface of the gate metal layer 140 to form the photoresist pattern 150. The photoresist composition may be a positive photoresist composition such that a light-exposed portion has an increased solubility to be removable by a developing solution. The photoresist composition may be exposed to a light and developed to form the photoresist pattern 150.

Figure 9:
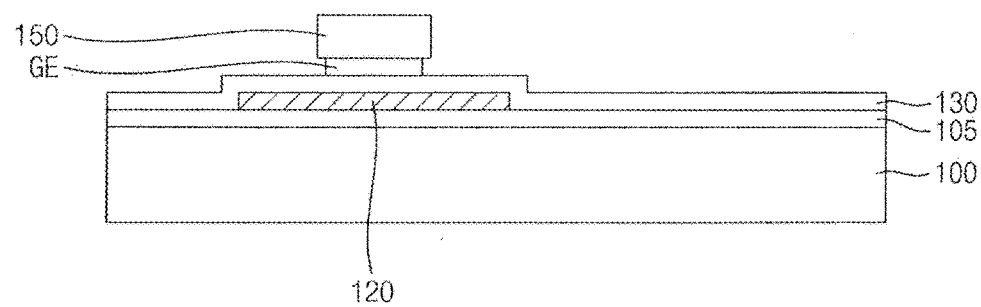

Referring to FIG. 9, the gate metal layer 140 may be etched by using the photoresist pattern 150 as an etching mask to form a gate metal pattern including a gate electrode GE. As a result, an upper surface of the first insulation layer 130 may be partially exposed.

The gate electrode GE overlaps the polysilicon pattern 120

Figure 10:
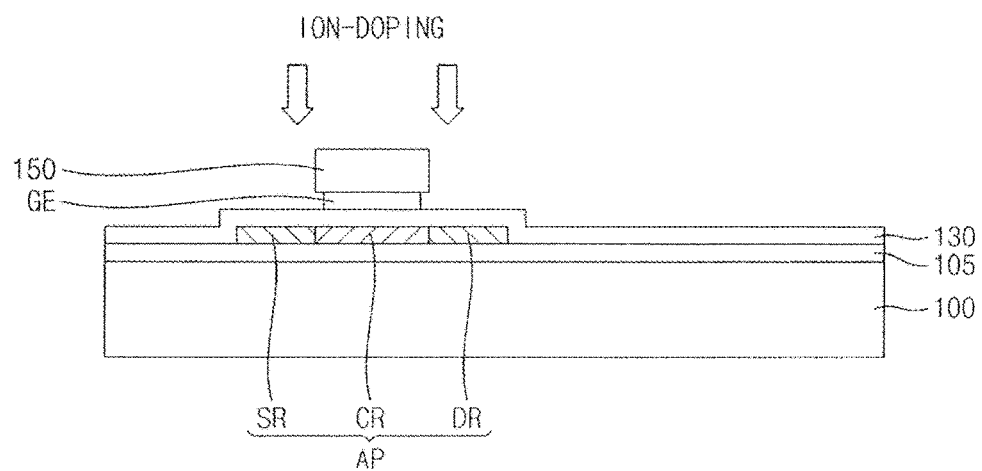

Referring to FIG. 10, the polysilicon pattern 120 may be partially doped through an ion implantation process to form an active pattern AP including a source region SR, a channel region CR and a drain region DR. An ion implanted into the polysilicon pattern 120 may be an n-type impurity or a p-type impurity.

A portion of the polysilicon pattern 120, which overlaps the photoresist pattern 150 and the gate electrode GE, may not be doped and may remain to form the channel region CR. Another portion of the polysilicon pattern 120, which is doped with an ion, may have an increased conductivity to be turned into a conductor thereby forming the source region SR and the drain region DR. The channel region CR may be disposed between the source region SR and the drain region DR.

In another exemplary embodiment, the ion implantation process may be performed after the photoresist pattern 150 is removed.

In an implementation, the active pattern AP may be doped with a low concentration ion after the photoresist pattern 150 removed. As a result, a low concentration doped region may be formed between the source region SR and the channel region CR and between the drain region DR and the channel region CR. The low concentration doped region may function as a buffer in the active pattern AP to help improve electrical properties of a thin film transistor.

Figure 11:
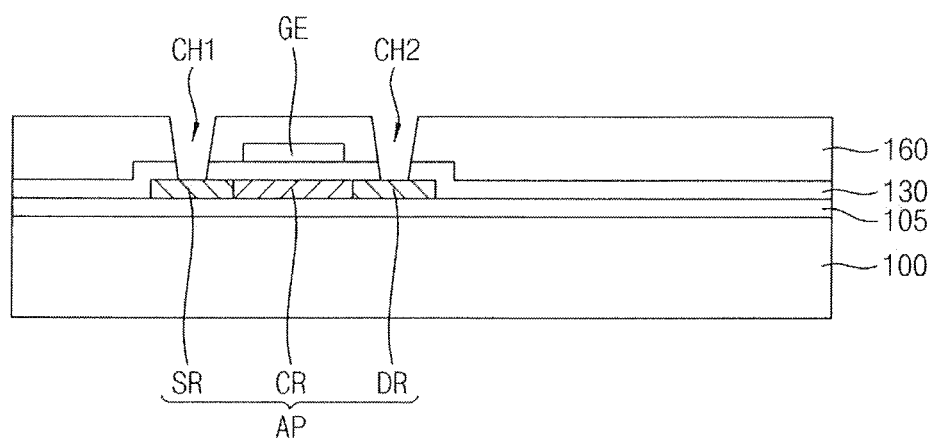

Referring to FIG. 11, a second insulation layer 160 may be formed to cover the gate electrode GE and the first insulation layer 130.

The second insulation layer 160 may include an organic insulation layer, an inorganic insulation layer, or a combination thereof. For example, the second insulation layer 160 may have a single-layered structure or a multiple-layered structure, which includes at least one of silicon oxide and silicon nitride. When the second insulation layer 160 includes an organic insulation layer, the second insulation layer 160 may include polyimide, polyamide, acrylic resin, phenol resin, benzocyclobutene (BCB), or the like.

The second insulation layer 160 and the first insulation layer 130 may be patterned to form a first contact hole CH1 exposing the source region SR, and a second contact hole CH2 exposing the drain region DR.

Figure 12:
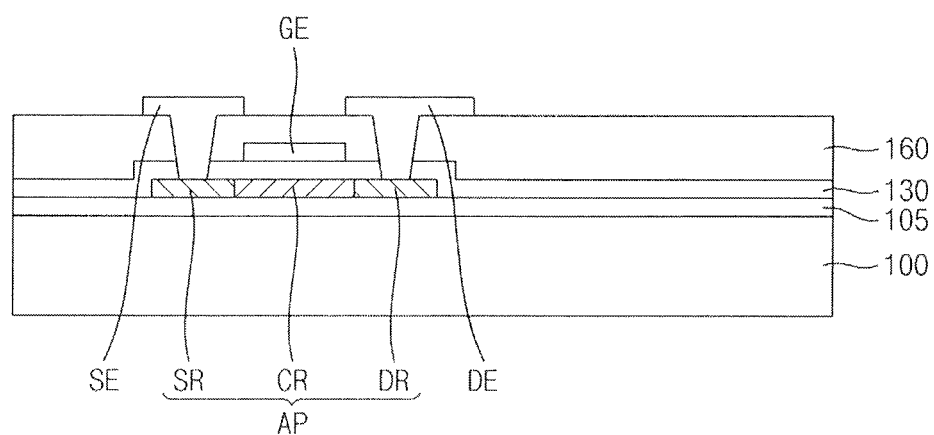

Referring to FIG. 12, a source metal layer may be formed on the second insulation layer 160 and patterned to form a source pattern including a source electrode SE contacting the source region SR, and a drain electrode DE contacting the drain region DR.

The source metal layer may include gold, silver, aluminum, copper, nickel, platinum, magnesium, chrome, tungsten, molybdenum, titanium, or an alloy thereof. The source metal layer may have a single-layered structure or a multiple-layered structure including different metal layers. For example, the source metal layer may include a triple layer of molybdenum/aluminum/molybdenum, or a double layer of copper/titanium. Furthermore, the source metal layer may further include a metal oxide layer disposed on and/or under a metal layer. The metal oxide layer may include indium tin oxide, indium zinc oxide, gallium zinc oxide or the like.

In an implementation, the source pattern may further include a power source line and a data line, which may be electrically connected to the source electrode SE.

Figure 13:
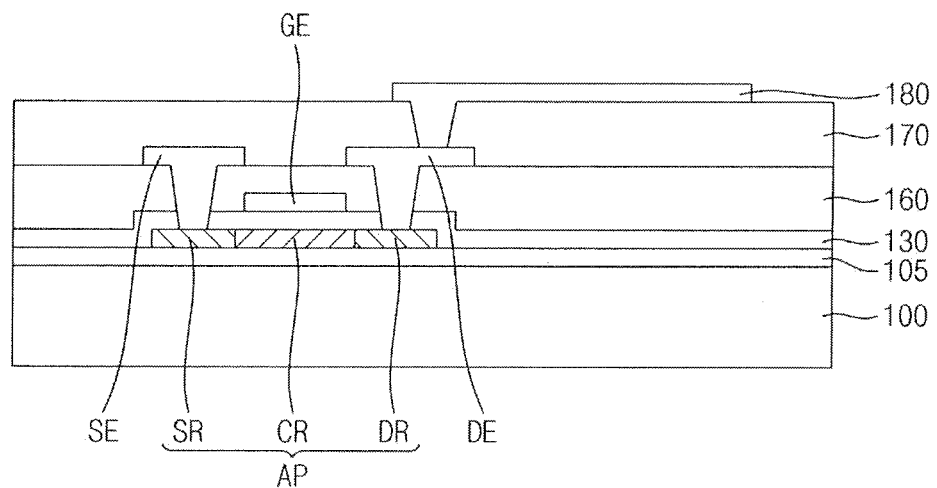

Referring to FIG. 13, a third insulation layer 170 may be formed to cover the source electrode SE, the drain electrode DE, and the second insulation layer 160.

The third insulation layer 170 may include an organic insulation layer, an inorganic insulation layer, or a combination thereof. For example, the third insulation layer 170 may have a single-layered structure or a multiple-layered structure, which includes at least one of silicon oxide and silicon nitride. When the third insulation layer 170 includes an organic insulation layer, the third insulation layer 170 may include polyimide, polyamide, acrylic resin, phenol resin, benzocyclobutene (BCB), or the like.

The third insulation layer 170 may be patterned to form a contact hole exposing the drain electrode DE.

A first electrode metal layer may be formed on the third insulation layer 170 and patterned to form a first electrode 180 contacting the drain electrode DE. The first electrode 180 may be a pixel electrode of a display device including the thin film transistor substrate. The first electrode 180 may be formed as a transparent electrode or a reflective electrode depending on an emitting type of the display device. When the first electrode 180 is a transparent electrode, the first electrode 180 may include indium tin oxide, indium zinc oxide, zinc tin oxide, indium oxide (InOx), zinc oxide (ZnOx), tin oxide (SnOx), or the like. When the first electrode 180 is a reflective electrode, the first electrode 180 may include gold, silver, aluminum, copper, nickel, platinum, magnesium, chrome, tungsten, molybdenum, titanium, or the like, and may further include the materials for the transparent electrode to have a stacked structure.

Figure 14:
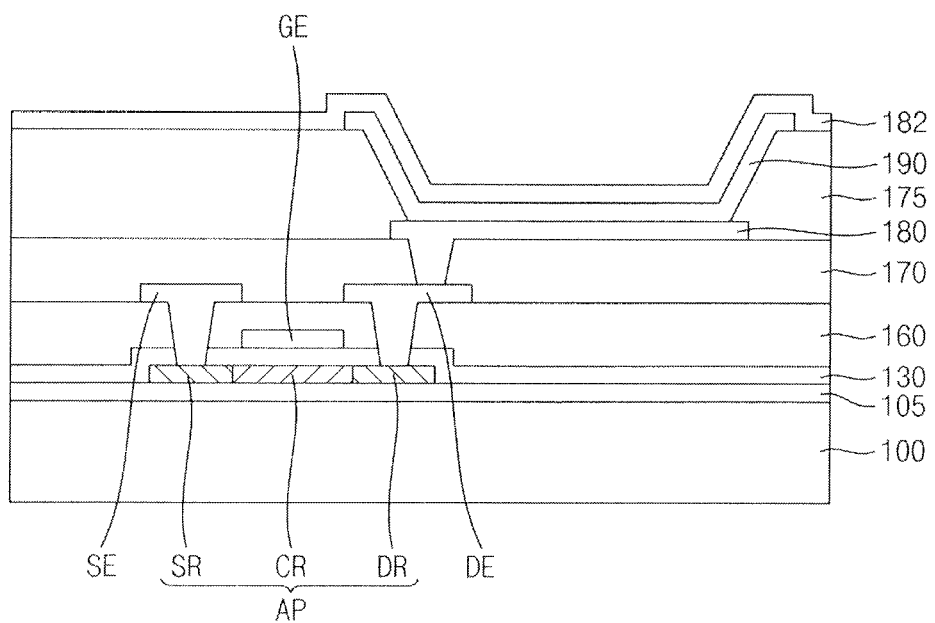

Referring to FIG. 14, a pixel insulation pattern 175 may be formed on the third insulation layer 170. The pixel insulation pattern 175 may have an opening exposing at least a portion of the first electrode 180. For example, the pixel insulation pattern 175 may include an organic insulation layer.

A light-emitting layer 190 may be formed on the first electrode 180. The light-emitting layer 190 may have a single-layered structure or a multiple-layered structure, which includes at least one of a hole injection layer, a hole transportation layer, an organic light-emitting layer, an electron transportation layer, an electron injection layer.

The light-emitting layer 190 may include a low molecular weight organic compound or a high molecular weight organic compound. Examples of the low molecular weight organic compound may include copper phthalocyanine, N,N'-diphenylbenzidine, (tris-(8-hydroxyquinoline)aluminum or the like. Examples of the high molecular weight organic compound may include poly(3,4-ethylenedioxythiophene), polyaniline, poly-phenylenevinylene, polyfluorene or the like.

In an exemplary embodiment, the light-emitting layer 190 may emit a red light, a green light or a blue light. In another exemplary embodiment, the light-emitting layer 190 may emit a white light. The light-emitting layer 190 emitting a white light may have a multiple-layered structure including a red-emitting layer, a green-emitting layer and a blue-emitting layer, or a single-layered structure including a mixture of a red-emitting material, a green-emitting material and a blue-emitting material.

For example, the light-emitting layer 190 may be formed through a screen printing process, an ink-jet printing process or the like.

A second electrode 182 may be formed on the light-emitting layer 190. The second electrode 182 may be formed as a transparent electrode or a reflective electrode depending on an emitting type of the display device. For example, when the second electrode 182 is the transparent electrode, the second electrode 182 may include lithium, calcium, lithium fluoride, aluminum, magnesium, or a combination thereof, and may further include a sub electrode or a bus electrode line, which includes indium tin oxide, indium zinc oxide, zinc tin oxide, indium oxide, zinc oxide, tin oxide, or the like.

In an implementation, the thin film transistor substrate may have a front-emitting type in which a light exits through the second electrode 182. In an implementation, the thin film transistor substrate may have a rear-emitting type in which a light exits through the first electrode 180.

In an implementation, the thin film transistor substrate may be used for an organic light-emitting display device. In an implementation, a thin film transistor substrate for a liquid crystal display device may be provided. For example, the thin film transistor substrate for a liquid crystal display device may be manufactured by forming an alignment layer on the first electrode 180 without the pixel insulation pattern 175, a light-emitting layer 190, and the second electrode 182.

According to an exemplary embodiment, a protrusion of a polysilicon film formed through crystallizing an amorphous silicon film may be removed through a polishing process. Thus, electrical properties of a thin film transistor may be improved.

Furthermore, a surface of the polished polysilicon film may have hydrophilicity. Thus, a polishing particle and a byproduct particle, which may remain on the polysilicon film after the polishing process, may then be easily removed. Thus, contamination of the polysilicon film due to adhesion of impurities may be prevented.

Hereinafter, effects of exemplary embodiments will be explained with reference to specific examples and experiments.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

About 1% by weight of precipitated ceria particles having an average particle size of about 40 nm, about 0.03% by weight of Darvan C—N(polymethacrylic acid, trade name, manufactured by Vanderbilt Minerals) as a dispersing agent, about 0.02% by weight of citric acid as a stabilizing agent, about 0.005% by weight of sodium dodecylsulfate as a hydrophilic agent, and a balance of deionized water were mixed, and ammonium hydroxide was added thereto to prepare a polishing slurry having a pH of about 10.

Example 2

A polishing slurry having a pH of about 10 was prepared by a substantially same method as Example 1 except for including about 0.01% by weight of sodium dodecylsulfate as a hydrophilic agent.

Example 3

A polishing slurry having a pH of about 10 was prepared by a substantially same method as Example 1 except for including about 0.05% by weight of sodium dodecylsulfate as a hydrophilic agent.

Example 4

A polishing slurry having a pH of about 10 was prepared by a substantially same method as Example 1 except for including about 0.1% by weight of sodium dodecylsulfate as a hydrophilic agent.

Example 5

A polishing slurry having a pH of about 10 was prepared by a substantially same method as Example 1 except for including about 0.5% by weight of sodium dodecylsulfate as a hydrophilic agent.

Example 6

A polishing slurry having a pH of about 10 was prepared by a substantially same method as Example 1 except for including about 1% by weight of sodium dodecylsulfate as a hydrophilic agent.

Example 7

A polishing slurry having a pH of about 10 was prepared by a substantially same method as Example 1 except for including about 3% by weight of sodium dodecylsulfate as a hydrophilic agent.

Comparative Example 1

A polishing slurry having a pH of about 10 was prepared by a substantially same method as Example 1 except for not including a hydrophilic agent (e.g., not including sodium dodecylsulfate).

Experiment 1—Contact Angle of Polishing Slurry

An amorphous silicon film having a thickness of about 47.5 nm was formed on a glass substrate having a size of 730×920, and crystallized through excimer laser annealing to form a polysilicon film. Polishing slurries of Examples 1 to 6 and Comparative Example 1 were respectively dropped on the polysilicon film. A contact angle of each of the polishing slurry drops was measured and represented in the following Table 1. The contact angle is defined as an angle between a side surface of a drop and an upper surface of the polysilicon film, and a smaller contact angle represents a larger hydrophilic ability.

TABLE 1

|  | Contact angle (°) |
| --- | --- |
| Comparative Example 1 | 36 |
| Example 1 | 19.2 |
| Example 2 | 7.9 |
| Example 3 | 7.65 |
| Example 4 | 7.5 |
| Example 5 | 5.7 |
| Example 6 | 4.2 |

Referring to Table 1, it may be seen that the polishing slurries of Examples 1 to 6, which included the hydrophilic agent had a larger hydrophilicity than the polishing slurry of Comparative Example 1, which did not include the hydrophilic agent. Furthermore, it may be seen that when a weight ratio of the hydrophilic agent to a polishing particle was equal to or more than 0.01, a hydrophilicity was much more increased.

Experiment 2—Polishing Ratio

A polysilicon film prepared by a same method as Experiment 1 was polished by the polishing slurries of Examples 1 to 7 and Comparative Example 1 and a polishing apparatus (manufactured by CMT Korea) with a rotation speed of about 30 RPM (head/pad) for about 60 seconds. A maximum thickness of the polished polysilicon film was measured and represented in the following Table 2.

TABLE 2

|  | Thickness (nm) |
| --- | --- |
| Comparative Example 1 | 29.4 |
| Example 1 | 31.0 |
| Example 2 | 33.7 |
| Example 3 | 36.1 |
| Example 4 | 37.4 |
| Example 5 | 39.0 |
| Example 6 | 42.8 |
| Example 7 | 50.2 |

Referring to FIG. 2, a polysilicon film polished by the polishing slurry of Comparative Example 1, which did not include the hydrophilic agent, had a smallest thickness. As a content of the hydrophilic agent increased, a thickness of the polished polysilicon film gradually increased, which means that a polishing ratio decreased. In the case of Example 7, which included about 3% by weight of the hydrophilic agent, it may be seen that the polysilicon film was hardly polished.

Experiment 3—Removing Remaining Impurities

Figure 15A:
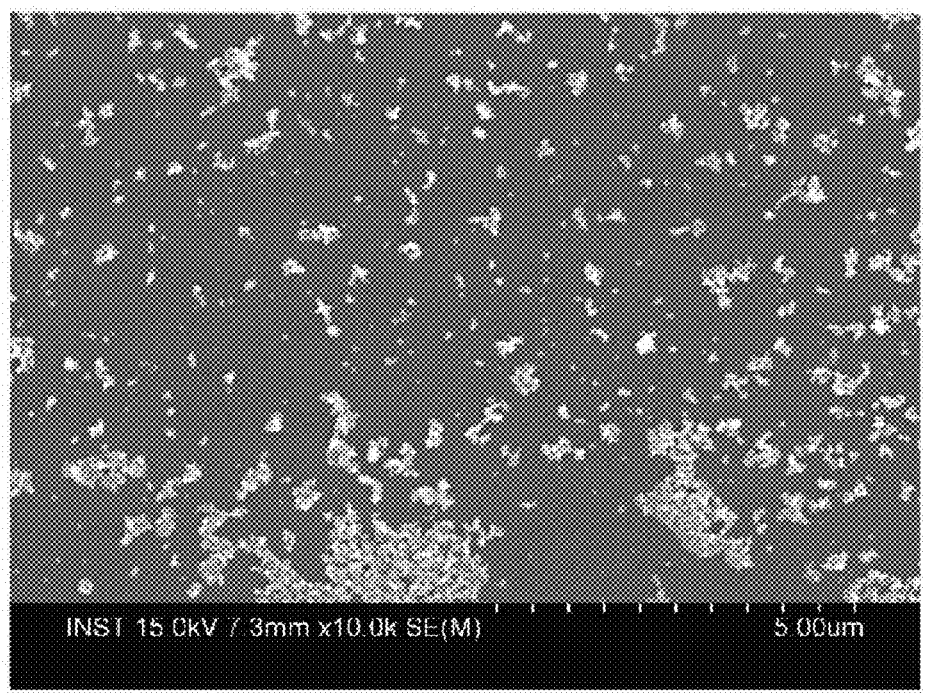
FIG. 15A and FIG. 15B illustrate images of polysilicon films polished by the polishing slurries of Comparative Example 1 and Example 3.
Figure 15B:
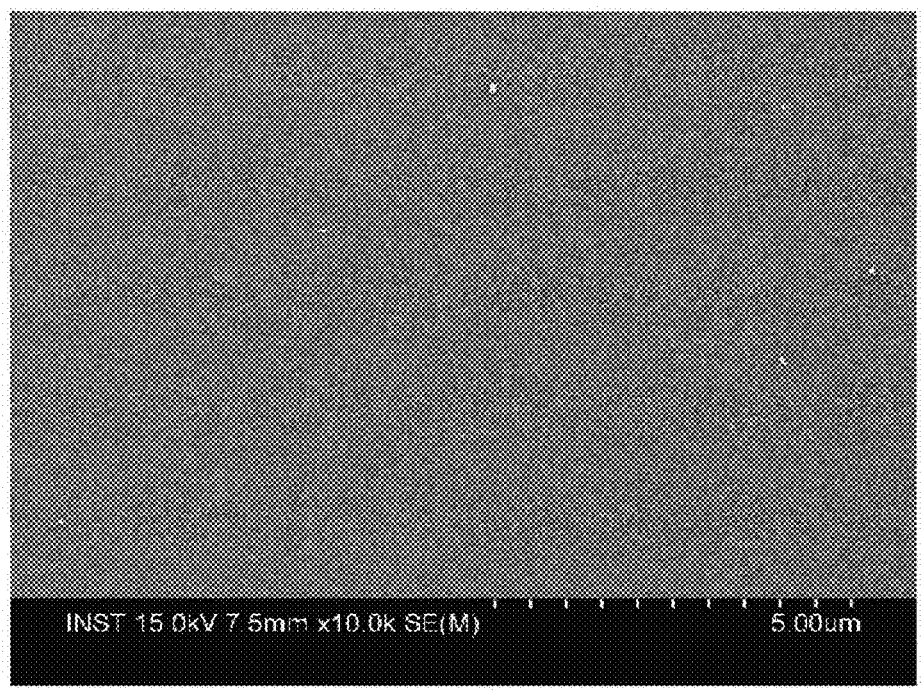

FIG. 15A and FIG. 15B illustrate images of polysilicon films polished by the polishing slurries of Comparative Example 1 and Example 3.

Referring to FIG. 15A and FIG. 15B, it may be seen that polishing particles remaining on the polysilicon film polished by the polishing slurry of Example 3 (FIG. 15B) were less (e.g., in number) than those remaining on the polysilicon film polished by the polishing slurry of Comparative Example 1 (FIG. 15A).

Experiment 4—Hydrophilicity and Buffing Effect

Figure 16:
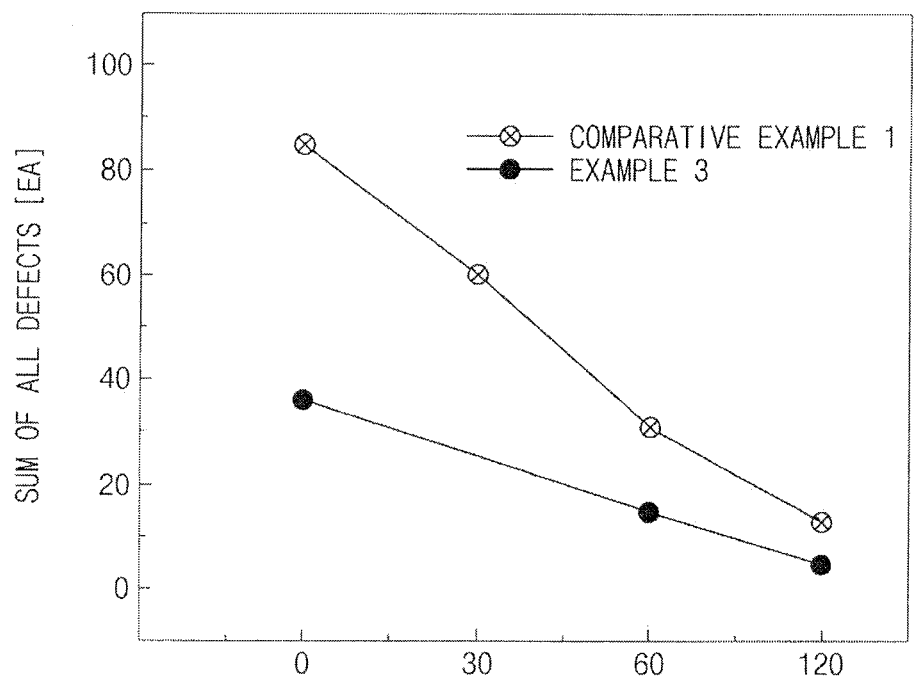
FIG. 16 illustrates a graph showing a number of defects observed on a surface of polysilicon films polished by the polishing slurries of Comparative Example 1 and Example 3.

FIG. 16 illustrates a graph showing a number of defects observed on a surface of polysilicon films polished by the polishing slurries of Comparative Example 1 and Example 3. The polysilicon films were polished for about 60 seconds. In FIG. 16, x axis represents a time (seconds) of an additional buffing process performed with deionized water, and y axis represents the number of observed defects. The number of defects when x axis is 0 was observed without the buffing process after deionized water was sprayed.

Referring to FIG. 16, fewer surface defects were observed in the polysilicon film polished by the polishing slurry of Example 3 than in the polysilicon film polished by the polishing slurry of Comparative Example 1. Furthermore, it may be seen that surface defects may be further reduced through the buffing process.

The following Table 3 represents a contact angle of a deionized water drop provided on the polysilicon films polished by the polishing slurries of Comparative Example 1 and Example 3. The contact angle was measured after a polishing process for 60 seconds, and after a rinsing process using deionized water and following the polishing process, and after a buffing process using a hydrophilic agent and deionized water and following the polishing process. Sodium dodecylsulfate was used for the hydrophilic agent of the buffing process. A smaller contact angle represents a larger hydrophilic ability of the polysilicon film.

TABLE 3

| | Process | Contact angle (°) |
| --- | --- | --- |
| Comparative Example 1 | Polishing | 36 |
| | Polishing/DI rinsing | 19.2 |
| | Polishing/DI buffing/hydrophilic buffing | 7.9 |
| Example 3 | Polishing | 7.65 |
| | Polishing/DI rinsing | 7.5 |
| | Polishing/DI buffing/hydrophilic buffing | 5.7 |

Referring to Table 3, it may be seen that the polysilicon film polished by the polishing slurry of Example 3 exhibited hydrophilicity even before the buffing process using the hydrophilic agent.

By way of summation and review, polysilicon may be used in order to help increase an electron mobility of a thin film transistor.

In order to form a channel that includes polysilicon, a low temperature polysilicon (LTPS) process that may be easily enlarged is used. According to the LTPS process, an amorphous silicon film may be formed on a substrate, and the amorphous silicon film is crystallized by laser or the like.

In the course of crystallizing the amorphous silicon film with a laser, protrusions may be formed on a surface of a silicon film so that a roughness of the silicon film may be increased. The increased roughness of the silicon film may deteriorate performance of a thin film transistor. When the silicon film is polished using polishing slurries in order to reduce the protrusions, polishing particles may adhere to the silicon film thereby contaminating the silicon film.

Exemplary embodiments may be used for manufacturing a display device such as an organic light-emitting display device, a liquid crystal display device or the like, or manufacturing various electronic devices including a silicon film.

According to an embodiment, a protrusion of a polysilicon film formed through crystallizing an amorphous silicon film may be removed through a polishing process. Thus, electrical properties of a thin film transistor may be improved.

A surface of the polished polysilicon film may have hydrophilicity. Thus, a polishing particle and a byproduct particle, which may remain on the polysilicon film after the polishing process, may be easily removed. Thus, contamination of the polysilicon film due to adhesion of impurities may be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A polishing slurry for silicon, the polishing slurry comprising:
a polishing particle;
a dispersing agent including at least one selected from the group consisting of an anionic polymer, a hydroxyl acid, and an amino acid;
a stabilizing agent including an organic acid, the organic acid including a carboxyl group;
a hydrophilic agent including a hydrophilic group and a hydrophobic group, and
water,
wherein:
the polishing particle is included in the polishing slurry in an amount of about 0.1% by weight to about 10% by weight, based on a total weight of the polishing slurry,
a weight ratio of the polishing particle and the dispersing agent is about 1:0.01 to about 1:0.2,
a weight ratio of the polishing particle and the stabilizing agent is about 1:0.001 to about 1:0.1, and
a weight ratio of the polishing particle and the hydrophilic agent is about 1:0.01 to about 1:3, and
wherein a pH of the polishing slurry is about 9 to about 11.

2. The polishing slurry for silicon as claimed in claim 1, wherein the polishing particle includes at least one selected from the group consisting of silica, alumina, ceria, zirconia, and titania.

3. The polishing slurry for silicon as claimed in claim 1, wherein an average particle size of the polishing particle is about 6 nm to about 350 nm.

4. The polishing slurry for silicon as claimed in claim 1, wherein the anionic polymer includes at least one selected from the group consisting of polysulfonic acid, polyacrylic acid, polymethacrylic acid, a copolymer thereof, and a salt thereof.

5. The polishing slurry for silicon as claimed in claim 1, wherein:
the hydrophilic agent includes an anionic hydrophilic agent or a non-ionic hydrophilic agent,
the anionic hydrophilic agent includes at least one selected from the group consisting of a stearate, a sulfonate, a sulfate, and a phosphate, and
the non-ionic hydrophilic agent includes at least one selected from the group consisting of polyethylene glycol, hydroxylethyl cellulose, polyvinylpyrrolidone, polyethylene amine, and a salt thereof.

6. The polishing slurry for silicon as claimed in claim 1, wherein:
the hydrophilic agent includes at least one selected from the group consisting of an alkylbenzene sulfonate, an alkylsulfate, and an alkylether sulfate, and
a weight ratio of the polishing particle and the hydrophilic agent is about 1:0.01 to about 1:1.

7. The polishing slurry for silicon as claimed in claim 1, wherein the stabilizing agent includes at least one selected from the group consisting of formic acid, acetic acid, butyric acid, oxalic acid, lactic acid, and citric acid.

8. A method of polishing polysilicon, the method comprising:
forming an amorphous silicon film;
irradiating a laser to the amorphous silicon film to form a polysilicon film; and
polishing the polysilicon film with a polishing slurry,
wherein the polishing slurry includes:
a polishing particle,
a dispersing agent including at least one selected from the group consisting of an anionic polymer, a hydroxyl acid, and an amino acid,
a stabilizing agent including an organic acid, the organic acid including a carboxyl group,
a hydrophilic agent including a hydrophilic group and a hydrophobic group, and
water,
wherein:
the polishing particle is included in the polishing slurry in an amount of about 0.1% by weight to about 10% by weight, based on a total weight of the polishing slurry,
a weight ratio of the polishing particle and the dispersing agent is about 1:0.01 to about 1:0.2,
a weight ratio of the polishing particle and the stabilizing agent is about 1:0.001 to about 1:0.1, and a weight ratio of the polishing particle and the hydrophilic agent is about 1:0.01 to about 1:3, and wherein a pH of the polishing slurry is about 9 to about 11.

9. The method as claimed in claim 8, wherein a grain size of the polysilicon film is about 300 nm to about 320 nm.

10. The method as claimed in claim 8, further comprising polishing the polysilicon film with deionized water after polishing the polysilicon film with the polishing slurry.

11. The method as claimed in claim 8, further comprising polishing the polysilicon film with a same material as the hydrophilic agent of the polishing slurry after polishing the polysilicon film with the polishing slurry.

12. The method as claimed in claim 8, wherein:
the anionic polymer includes at least one selected from the group consisting of polysulfonic acid, polyacrylic acid, polymethacrylic acid, a copolymer thereof, and a salt thereof,
the hydrophilic agent includes at least one selected from the group consisting of an alkylbenzene sulfonate, an alkylsulfate, and an alkylether sulfate, and
the stabilizing agent includes at least one selected from the group consisting of formic acid, acetic acid, butyric acid, oxalic acid, lactic acid, and citric acid.

13. A method of manufacturing a thin film transistor substrate, the method comprising:
forming an amorphous silicon film on a base substrate;
irradiating a laser to the amorphous silicon film to form a polysilicon film;
polishing the polysilicon film with a polishing slurry, the polishing slurry including:
a polishing particle,
a dispersing agent including at least one selected from the group consisting of an anionic polymer, a hydroxyl acid, and an amino acid,
a stabilizing agent including an organic acid, the organic acid including a carboxyl group,
a hydrophilic agent including a hydrophilic group and a hydrophobic group, and
water,
wherein the polishing particle is included in the polishing slurry in an amount of about 0.1% by weight to about 10% by weight, based on a total weight of the polishing slurry, a weight ratio of the polishing particle and the dispersing agent is about 1:0.01 to about 1:0.2, a weight ratio of the polishing particle and the stabilizing agent is about 1:0.001 to about 1:0.1, and a weight ratio of the polishing particle and the hydrophilic agent is about 1:0.01 to about 1:3, wherein a pH of the polishing slurry is about 9 to about 11;
patterning the polysilicon film to form a polysilicon pattern;
forming a first insulation layer that covers the polysilicon pattern;
forming a gate metal layer on the first insulation layer;
patterning the gate metal layer to form a gate electrode; and
implanting an ion into a portion of the polysilicon pattern to form an active pattern including a source region, a channel region and a drain region.

14. The method as claimed in claim 13, wherein a thickness of the polysilicon film after polished is about 30 nm to about 50 nm.

15. The method as claimed in claim 13, wherein a root-mean-square roughness of the polysilicon film after polishing is less than about 1 nm.

16. The method as claimed in claim 13, wherein a grain size of the polysilicon film is about 300 nm to about 320 nm.

17. The method as claimed in claim 13, wherein a thickness of the first insulation layer is about 30 nm to about 80 nm.

18. The method as claimed in claim 13, further comprising polishing the polysilicon film with deionized water after polishing the polysilicon film with the polishing slurry.

19. The method as claimed in claim 13, further comprising polishing the polysilicon film with a same material as the hydrophilic agent of the polishing slurry after polishing the polysilicon film with the polishing slurry.

20. The method as claimed in claim 13, wherein:
the anionic polymer includes at least one selected from the group consisting of polysulfonic acid, polyacrylic acid, polymethacrylic acid, a copolymer thereof, and a salt thereof,
the hydrophilic agent includes at least one selected from the group consisting of an alkylbenzene sulfonate, an alkylsulfate, and an alkylether sulfate, and
the stabilizing agent includes at least one selected from the group consisting of formic acid, acetic acid, butyric acid, oxalic acid, lactic acid, and citric acid.

* * * * *